(12) United States Patent
Akbari et al.

(10) Patent No.: US 11,152,950 B2
(45) Date of Patent: Oct. 19, 2021

(54) ANALOG-TO-DIGITAL CONVERSION DEVICE COMPRISING TWO CASCADED NOISE-SHAPING SUCCESSIVE APPROXIMATION REGISTER ANALOG-TO-DIGITAL CONVERSION STAGES, AND RELATED ELECTRONIC SENSOR

(71) Applicant: THALES, Courbevoie (FR)

(72) Inventors: Masoume Akbari, Montréal (CA);
Mohamad Sawan, Montréal (CA)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/127,528

(22) Filed: Dec. 18, 2020

(65) Prior Publication Data

US 2021/0203348 A1    Jul. 1, 2021

(30) Foreign Application Priority Data

Dec. 26, 2019   (FR) ...................... 19 15610

(51) Int. Cl.
*H03M 1/34*   (2006.01)
*H03M 1/46*   (2006.01)
(Continued)

(52) U.S. Cl.
CPC ......... *H03M 1/462* (2013.01); *H03M 1/0626* (2013.01); *H03M 1/1205* (2013.01)

(58) Field of Classification Search
CPC ...... H03M 3/458; H03M 1/468; H03M 3/464; H03M 1/12; H03M 3/426; H03M 1/46;
(Continued)

(56) References Cited

U.S. PATENT DOCUMENTS 5,500,645 A * 3/1996 Ribner .................. H03M 3/414
                                                  341/118
6,323,794 B1 * 11/2001 Okuda ................ H03M 7/3022
                                                  341/143
(Continued)

OTHER PUBLICATIONS

Abhilash, K N et al., A reconfigurable 0-L1-L2 S-MASH2 modulator with high-level sizing and power estimation, 2014 27th IEEE International, System-On-Chip Conference (SOCC), pp. 347-352, (2014).

(Continued)

*Primary Examiner* — Linh V Nguyen
(74) *Attorney, Agent, or Firm* — Arent Fox LLP

(57) ABSTRACT

This analog-to-digital converting device comprises:
  an input terminal for receiving the analog input signal;
  an output terminal for issuing the digital output signal;
  a first successive approximation register analog-to-digital conversion module, called first SAR ADC module, connected to the input terminal;
  a first feedback module associated to the first SAR ADC module;
  a second successive approximation register analog-to-digital conversion module, called second SAR ADC module, connected in a cascaded manner to the first SAR ADC module;
  a second feedback module associated to the second SAR ADC module; and
  a multiplexing module connected to the first and second SAR ADC modules, to deliver the digital output signal.

13 Claims, 4 Drawing Sheets

(51) Int. Cl.
*H03M 1/06* (2006.01)
*H03M 1/12* (2006.01)

(58) Field of Classification Search
CPC ............ H03M 3/46; H03M 1/68; H03M 3/30; H03M 3/424; H03M 3/454; H03M 1/00; H03M 3/416; H03M 3/414; H03M 7/3022; H03M 3/332; H03M 3/374; H03M 3/394; H03M 3/45; H03M 3/452; H03M 3/506; H03M 1/06; H03M 1/0641; H03M 1/145; H03M 1/164; H03M 1/44; H03M 3/32; H03M 3/338; H03M 3/35; H03M 3/352; H03M 3/358
USPC ................. 341/118–120, 143, 155, 163, 172
See application file for complete search history.

(56) References Cited

U.S. PATENT DOCUMENTS

| | | | | |
|---|---|---|---|---|
| 7,626,525 | B2* | 12/2009 | Zhou | H03M 3/352 |
| | | | | 341/118 |
| 9,197,240 | B1* | 11/2015 | Kinyua | H03M 1/1265 |
| 2002/0093441 | A1* | 7/2002 | Wiesbauer | H03M 3/416 |
| | | | | 341/143 |
| 2005/0093726 | A1* | 5/2005 | Hezar | H03M 3/412 |
| | | | | 341/143 |
| 2008/0272944 | A1* | 11/2008 | Zhou | H03M 3/352 |
| | | | | 341/143 |
| 2018/0183450 | A1 | 6/2018 | Liu | |
| 2019/0181880 | A1* | 6/2019 | Huang | H03M 1/68 |
| 2019/0199367 | A1* | 6/2019 | Na | H03M 3/452 |
| 2019/0207620 | A1* | 7/2019 | Lee | H03M 3/494 |
| 2020/0228129 | A1* | 7/2020 | Huang | H03M 3/426 |
| 2020/0295776 | A1* | 9/2020 | Lo | H03M 3/426 |
| 2020/0304137 | A1* | 9/2020 | Iwata | H03M 3/424 |

OTHER PUBLICATIONS

French Search Report, from the French Patent Office in counterpart French Application No. 1915610, dated Sep. 9, 2020.

Li, S. et al., Chapter 2, Noise-Shaping SAR ADCs, Advances in Analog Circuit Design 2019, In: Next-Generation ADCs, High-Performance Power Management, and Technology Considerations for Advanced Integrated Circuits: Advances in Analog Circuit Design 2019, Springer International Publishing, (19 Pages Total), (2019).

Pachchigar, M., Demystifying High-Performance Multiplexed Data-Acquisition Systems, Analog Dialogue 48-07, analog.com/analogdialogue, 4 Pages Total, (Jul. 2014).

Song, Y. et al., A 77dB SNDR 12.5MHz Bandwidth 0-1 MASH ΣΔ ADC Based on the Pipelined-SAR Structure, 2018 Symposium on VLSI Circuits Digest of Technical Papers, pp. 203-204, (2018).

* cited by examiner

ANALOG-TO-DIGITAL CONVERSION DEVICE COMPRISING TWO CASCADED NOISE-SHAPING SUCCESSIVE APPROXIMATION REGISTER ANALOG-TO-DIGITAL CONVERSION STAGES, AND RELATED ELECTRONIC SENSOR

CROSS-REFERENCE TO RELATED APPLICATIONS

This application is a U.S. non-provisional application claiming the benefit of French Application No. 19 15610, filed on Dec. 26, 2019, which is incorporated herein by reference in its entirety.

FIELD

The present invention relates to an analog-to-digital converting device for converting an analog input signal into a digital output signal.

The invention also relates to an electronic sensor comprising such an analog-to-digital converting device.

BACKGROUND

This invention concerns the field of analog-to-digital converters, also denoted ADC, in particular in high-channel-density data-acquisition systems. Such analog-to-digital converters are typically used in biomedical and instrumentation applications.

Successive approximation register analog-to-digital converters, also denoted SAR ADC, are popular in multiplexed systems because of their low latency and fast response, even to a full-scale input step without any settling issues, as explained in the article "*Demystifying High-Performance Multiplexed Data-Acquisition Systems*" from M. Pachchigar, in Analog Dialogue, 2014. Successive approximation register analog-to-digital converters have been widely used in energy-efficient applications due to their simplicity and power efficiency.

A successive approximation register analog-to-digital converter typically includes a digital-to-analog converter, also denoted DAC, with an input and an output; a comparator with two inputs and an output, one input being connected to the output of the digital-to-analog converter and the other input being adapted to receive a reference signal; and a SAR logic unit connected to the output of the comparator, the SAR logic unit being adapted to control the digital-to-analog converter. The digital-to-analog converter generally contains a capacitor array.

US 2018/0183450 A1 concerns an interleaving successive approximation register analog-to-digital converter (SAR ADC) with noise-shaping having a first successive approximation register block, also called first SAR block, a second successive approximation register block, also called second SAR block, and a noise-shaping circuit. The first and second SAR blocks take turns to sample an input voltage for successive approximation of the input voltage and observation of a digital representation of the input voltage. The noise-shaping circuit receives a first residue voltage from the first SAR block and receives a second residue voltage from the second SAR block alternately, and outputs a noise-shaping signal to be fed into the first SAR block and the second SAR block. Such a successive approximation register analog-to-digital converter allows increasing the speed of the process, because when one SAR block is in conversion mode, the other one samples the next input.

However, successive approximation register analog-to-digital converters are suffering from significant noise of the comparator, as well as extra power needed to drive a large DAC capacitor array. Therefore, such successive approximation register analog-to-digital converters are barely used for more than 10-12 bit resolution applications.

SUMMARY

An object of the invention is therefore to provide an improved analog-to-digital converting device comprising at least one successive approximation register analog-to-digital converter.

For this purpose, the subject-matter of the invention is an analog-to-digital converting device for converting an analog input signal into a digital output signal, comprising:
- an input terminal for receiving the analog input signal;
- an output terminal for issuing the digital output signal;
- a first successive approximation register analog-to-digital conversion module, called first SAR ADC module, connected via its input to the input terminal and configured to deliver via its output a first digital signal;
- a first feedback module configured to receive a first residue signal from the first SAR ADC module and to process and inject it back at input of the first SAR ADC module;
- a second successive approximation register analog-to-digital conversion module, called second SAR ADC module, connected via its input to the first SAR ADC module to receive the first residue signal and configured to deliver via its output a second digital signal;
- a second feedback module configured to receive a second residue signal from the second SAR ADC module and to process and inject it back at input of the second SAR ADC module; and
- a multiplexing module connected to the output of the first SAR ADC module and to the output of the second SAR ADC module, the multiplexing module being configured to deliver the digital output signal at the output terminal.

The analog-to-digital converting device according to the invention therefore comprises two cascaded noise-shaping successive approximation register analog-to-digital conversion stages, also called NS-SAR ADC stages, namely a first NS-SAR ADC stage and a second NS-SAR ADC stage, each NS-SAR ADC stage including a SAR ADC module and a respective error feedback module to noise-shape a quantization noise of the SAR ADC module. The quantization noise of the first NS-SAR ADC stage, in particular of the first SAR ADC module, is fed into the second NS-SAR ADC stage to form a multi-stage noise-shaping (MASH) SAR ADC.

The skilled person will further note that the noise-shaping is performed by an error feedback technique such that the analog-to-digital converting device according to the invention is no longer using any operational transconductance amplifier (OTA). Therefore, it is indeed an OTA-free topology.

In optional addition, the multiplexing module is able to operate either in a first operating mode wherein the delivered digital output signal is the first digital signal or in a second operating mode wherein the delivered digital output signal is a combination of the first and second digital signals. Therefore, a further advantage of the analog-to-digital converting device according to the invention is the configurability such that it can be configured as either single-stage or multi-stage to support different bandwidths and resolutions.

In optional addition, each feedback module includes a respective second-order filter for filtering the respective residue signal before injecting it back at input of the respective SAR ADC module. Therefore, a further advantage of the analog-to-digital converting device according to the invention is to provide a fourth-order noise-shaping performance while being as stable as a second-order analog-to-digital converter.

According to other advantageous aspects of the invention, the analog-to-digital converting device comprises one or several of the following features, taken individually or according to any technically possible combination:

- the multiplexing module is configured to operate in a first operating mode wherein the delivered digital output signal is the first digital signal or in a second operating mode wherein the delivered digital output signal is a combination of the first and second digital signals;
- the converting device further comprises a selection module for selecting an operating mode among the first operating mode and the second operating mode of the multiplexing module;
- the first feedback module comprises a first filter for filtering the first residue signal before injecting it back at input of the first SAR ADC module,
- the first filter being preferably a second-order filter;
- the first filter being still preferably a finite impulse response filter;
- the second feedback module comprises a second filter for filtering the second residue signal before injecting it back at input of the second SAR ADC module,
- the second filter being preferably a second-order filter;
- the second filter being still preferably a finite impulse response filter;
- the first SAR ADC module comprises:
  - a first digital-to-analog converter with an input and an output;
  - a first comparator with two inputs and an output, one input being connected to the output of the first digital-to-analog converter and the other input being adapted to receive a reference signal; and
  - a first successive approximation register logic unit connected to the output of the first comparator, the first successive approximation register logic unit being adapted to control the first digital-to-analog converter;
  - the input of the first digital-to-analog converter forming the input of the first SAR ADC module;
  - the output of the first comparator forming the output of the first SAR ADC module;
- the input of the second SAR ADC module is connected to the output of the first digital-to-analog converter;
- the second SAR ADC module comprises:
  - a second digital-to-analog converter with an input and an output;
  - a second comparator with two inputs and an output, one input being connected to the output of the second digital-to-analog converter and the other input being adapted to receive a reference signal; and
  - a second successive approximation register logic unit connected to the output of the second comparator, the second successive approximation register logic unit being configured to control the second digital-to-analog converter;
  - the input of the second digital-to-analog converter forming the input of the second SAR ADC module;
  - the output of the second comparator forming the output of the second SAR ADC module;
- the multiplexing module comprises a digital cancellation logic unit adapted to apply a first transfer function to the first digital signal and a second transfer function to the second digital signal, so as to cancel the first residue signal.

The subject-matter of the invention is also an electronic sensor comprising an analog-to-digital converting device for converting an analog input signal into a digital output signal, the converting device being as defined above.

BRIEF DESCRIPTION OF THE DRAWINGS

The invention will be better understood upon reading of the following description, which is given solely by way of example and with reference to the appended drawings, wherein.

DETAILED DESCRIPTION

In the following description, NS stands for Noise-Shaping; SAR stands for Successive Approximation Register; and ADC stands for Analog-to-Digital Converter or Analog-to-Digital Conversion. Thus, NS-SAR ADC stands for a noise-shaping successive approximation register analog-to-digital converter, or conversion stage.

Figure 1:
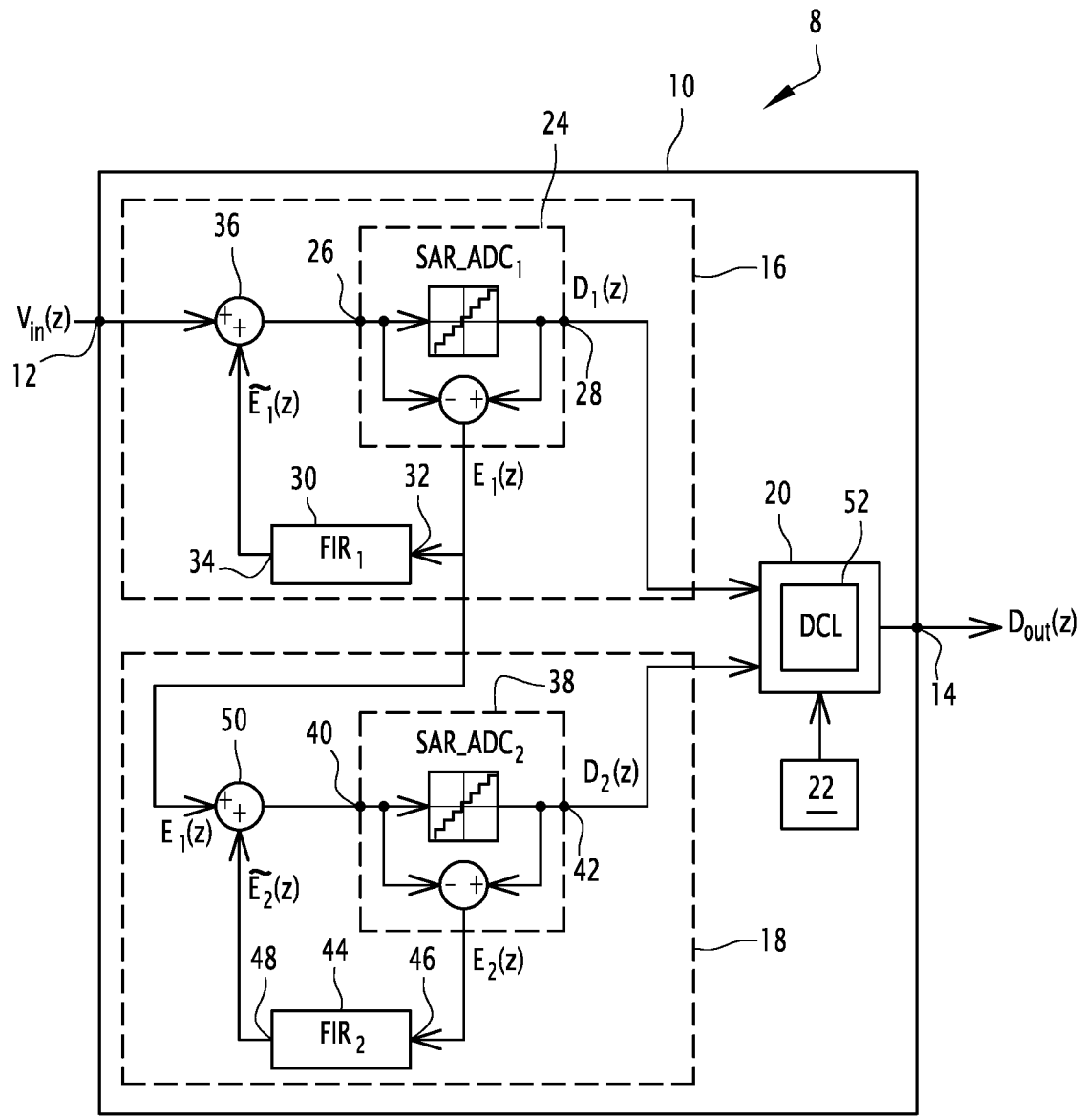
FIG. 1 is a schematic view of an electronic sensor comprising an analog-to-digital converting device according to the invention, the converting device including a first NS-SAR ADC stage and a second NS-SAR ADC stage, the second NS-SAR ADC stage being connected in a cascaded manner to the first NS-SAR ADC stage, in order to feed a quantization noise of the first NS-SAR ADC stage into the second NS-SAR ADC stage; this view being in the form of a block diagram, also called linear model.

In FIG. 1, an electronic sensor 8 comprises an analog-to-digital converting device 10 for converting an analog input signal $V_{in}(z)$ into a digital output signal $D_{out}(z)$. The electronic sensor 8 is adapted to be used in various applications, such as biomedical and/or instrumentation applications.

The analog-to-digital converting device 10 is configured to convert the analog input signal $V_{in}(z)$ into the digital output signal $D_{out}(z)$ and comprises an input terminal 12 for receiving the analog input signal $V_{in}(z)$ and an output terminal 14 for issuing the digital output signal $D_{out}(z)$.

The analog-to-digital converting device 10 further comprises a first noise-shaping successive approximation register analog-to-digital conversion stage 16, also called first NS-SAR ADC stage, and a second noise-shaping successive approximation register analog-to-digital conversion stage 18, also called second NS-SAR ADC stage, the second NS-SAR ADC stage 18 being connected in a cascaded manner to the first NS-SAR ADC stage 16, and a multiplexing module 20 connected respectively to the output of first NS-SAR ADC stage 16 and to the output of second NS-SAR ADC stage 18, the multiplexing module 20 being configured to deliver the digital output signal $D_{out}(z)$ at the output terminal 14, from a first digital signal $D_1(z)$ coming from the first stage NS-SAR ADC 16, or additionally from a second digital signal $D_2(z)$ coming from the second stage NS-SAR ADC 18.

The skilled person will understand that the term "multiplexing" generally refers to the act of grouping information or signals from several channels on a single channel. The multiplexing module 20 shall then be understood as a module capable of grouping together at output terminal 14 the signals coming from several channels, i.e. the signals coming from the NS-SAR ADC stages 16, 18, the multiplexing module 20 being configured to deliver the digital output signal $D_{out}(z)$ at the output terminal 14, this from the first digital signal $D_1(z)$ coming from the first NS-SAR ADC 16 stage, or even additionally from the second digital signal $D_2(z)$ coming from the second NS-SAR ADC 18 stage, i.e. from the combination of the first digital signal $D_1(z)$ and the second digital signal $D_2(z)$.

As an optional addition, the multiplexing module 20 is configured to operate in a first operating mode M1 wherein the delivered digital output signal $D_{out}(z)$ is the first digital signal $D_1(z)$ or in a second operating mode M2 wherein the delivered digital output signal $D_{out}(z)$ is a combination of the first and second digital signals $D_1(z)$, $D_2(z)$.

According to this optional addition, the converting device 10 further comprises a selection module 22 configured to select an operating mode among the first operating mode M1 and the second operating mode M2 of the multiplexing module 20.

The first NS-SAR ADC stage 16 includes a first successive approximation register analog-to-digital conversion module 24, called first SAR ADC module 24, also denoted $SAR\_ADC_1$, connected via its input 26 to the input terminal 12 and configured to deliver via its output 28 a first digital signal $D_1(z)$.

The first NS-SAR ADC stage 16 also includes a first feedback module 30 configured to receive via its input 32 a first residue signal $E_1(z)$ from the first SAR ADC module 24 and to process and inject it back, via its output 34, at input 26 of the first SAR ADC module 24.

In the example of FIG. 1, the first NS-SAR ADC stage 16 includes a first adder 36 connected on one hand to the input terminal 12 and to the output 34 of the first feedback module 30, and on the other hand to the input 26 of the first SAR ADC module 24. The first adder 36 is configured for adding the signal processed by the first feedback module 30, also denoted $\widetilde{E_1}(z)$, to the analog input signal $V_{in}(z)$ and for delivering this sum of signals $\widetilde{E_1}(z)+V_{in}(z)$ to the input 26 of the first SAR ADC module 24.

The second NS-SAR ADC stage 18 includes a second successive approximation register analog-to-digital conversion module 28, called second SAR ADC module 38, also denoted $SAR\_ADC_2$, connected via its input 40 to the first SAR ADC module 24 to receive the first residue signal $E_1(z)$ and configured to deliver via its output 42 a second digital signal $D_2(z)$.

The second NS-SAR ADC stage 18 also includes a second feedback module 44 configured to receive via its input 46 a second residue signal $E_2(z)$ from the second SAR ADC module 38 and to process and inject it back, via its output 48, at input 40 of the second SAR ADC module 38.

In the example of FIG. 1, the second NS-SAR ADC stage 18 includes a second adder 50 connected on one hand to the first NS-SAR ADC stage 16 and to the output 48 of the second feedback module 44, and on the other hand to the input 40 of the second SAR ADC module 38. The second adder 50 is configured for adding the signal processed by the second feedback module 44, also denoted $\widetilde{E_2}(z)$, to the first residue signal $E_1(z)$ and for delivering this sum of signals $\widetilde{E_2}(z)+E_1(z)$ to the input 40 of the second SAR ADC module 38.

The multiplexing module 20 is configured to deliver the digital output signal $D_{out}(z)$ from the first digital signal $D_1(z)$ and the second digital signal $D_2(z)$. The multiplexing module 20 is connected to the output 28 of the first SAR ADC module 24 and to the output 42 of the second SAR ADC module 38.

The multiplexing module 20 is preferably configured to deliver, as the digital output signal $D_{out}(z)$ at the output terminal 14, either the first digital signal $D_1(z)$ or the combination of the first $D_1(z)$ and second $D_2(z)$ digital signals.

Figure 2:
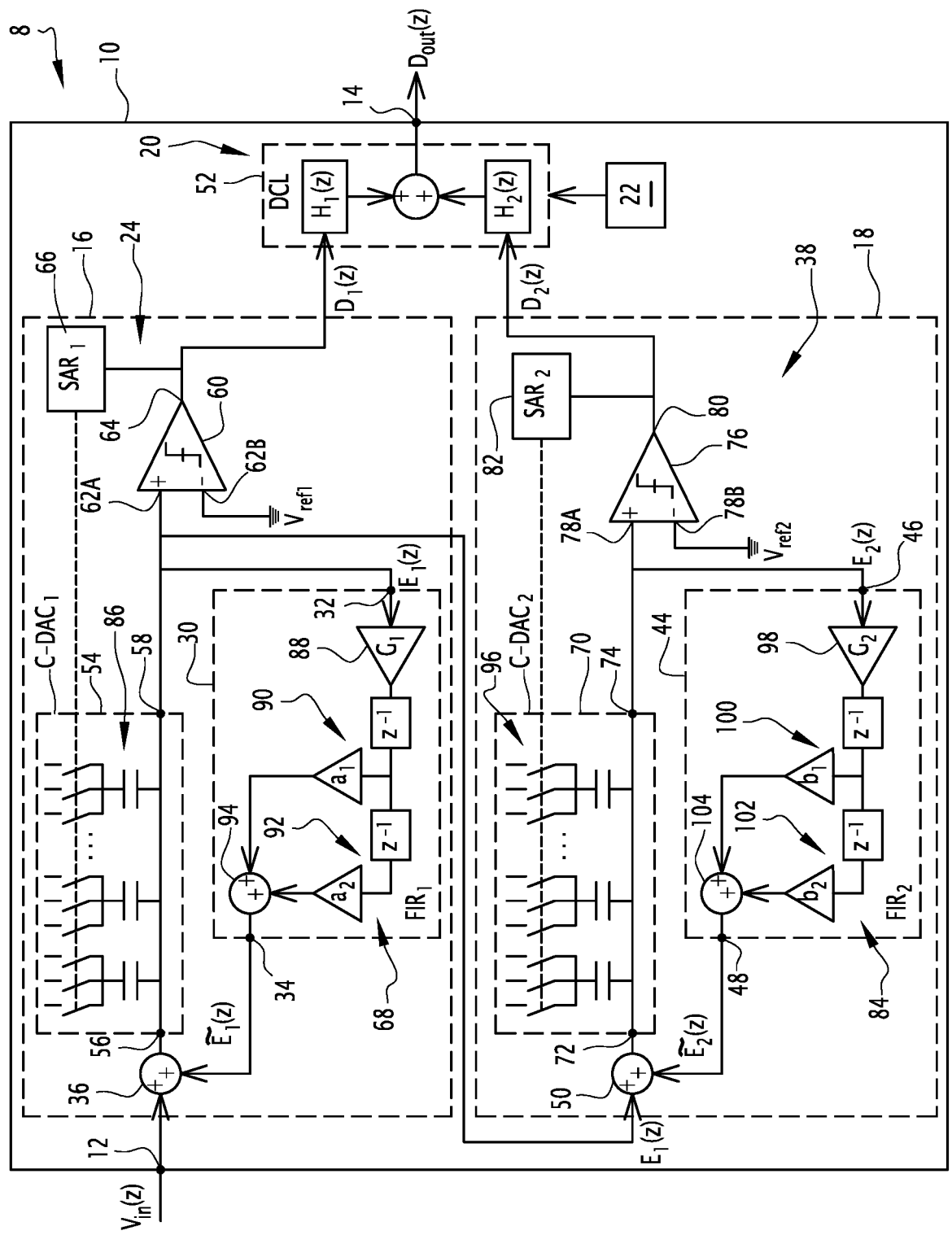
FIG. 2 is a view similar to the one of FIG. 1, in the form of a time-domain behavioral model.

The multiplexing module 20 includes a digital cancellation logic unit 52, also denoted DCL, adapted to apply a first transfer function $H_1(z)$ to the first digital signal $D_1(z)$ and a second transfer function $H_2(z)$ to the second digital signal $D_2(z)$, as shown in FIG. 2. The digital cancellation logic unit 52 is adapted to cancel the first residue signal $E_1(z)$.

In the example of FIG. 2, the first SAR ADC module 24 includes a first digital-to-analog converter 54, also denoted $C-DAC_1$, with an input 56 and an output 58. The input 56 of the first digital-to-analog converter 54 forms the input 26 of the first SAR ADC module 24.

The skilled person will observe that the input 56, which forms the input of the first SAR ADC module 24 whose function is to perform analog-to-digital conversion, is an input of the first digital-to-analog converter 54, but not its single input. The skilled person will then understand that the input 56 is an analog input corresponding to an additional input, known per se for a SAR ADC module, of said digital-to-analog converter 54, and not the digital input intended to receive the digital signal for conversion to an analog signal. The additional input 56 is configured for receiving a reference voltage used to normalize said digital input. In the example of FIG. 2, said reference voltage corresponds to the signal delivered by the first adder 36 to the first SAR ADC module 24, i.e. corresponds to the sum of signals $\widetilde{E_1}(z)+V_{in}(z)$.

The first SAR ADC module 24 also includes a first comparator 60 with two inputs 62A, 62B, namely a first input 62A and a second input 62B, and an output 64. One input of the first comparator 60, such as the first input 62A, is connected to the output 58 of the first digital-to-analog converter 54 and the other input, such as the second input 62A, is adapted to receive a reference signal, such a first reference voltage $V_{ref1}$. The output 64 of the first comparator 60 forms the output 28 of the first SAR ADC module 24.

The first SAR ADC module 24 further includes a first successive approximation register logic unit 66, also called first SAR logic unit 66 and denoted $SAR_1$, connected to the output 64 of the first comparator 60, the first SAR logic unit 66 being adapted to control the first digital-to-analog converter 54.

The first feedback module 30 includes a first filter 68 for filtering the first residue signal $E_1(z)$ before injecting it, as a first filtered residue signal $\widetilde{E_1}(z)$, back at input 26 of the first SAR ADC module 24.

In the example of FIG. 2, the second SAR ADC module 38 includes a second digital-to-analog converter 70, also denoted C-DAC$_2$, with an input 72 and an output 74. The input 72 of the second digital-to-analog converter 70 forms the input 40 of the second SAR ADC module 38.

The skilled person will observe that the input 72, which forms the input of the second SAR ADC module 58 whose function is to perform analog-to-digital conversion, is an input of the second digital-to-analog converter 70, but not its single input. The skilled person will then understand that the input 72 is an analog input corresponding to an additional input, known per se for a SAR ADC module, of said digital-to-analog converter 70, and not the digital input intended to receive the digital signal for conversion to an analog signal. The additional input 72 is configured for receiving a reference voltage used to normalize said digital input. In the example of FIG. 2, said reference voltage corresponds to the signal delivered by the second adder 50 to the second SAR ADC module 38, i.e. corresponds to the sum of signals $\widetilde{E}_2(z) + E_1(z)$.

The second SAR ADC module 38 also includes a second comparator 76 with two inputs 78A, 78B, namely a first input 78A and a second input 78B, and an output 80. One input of the second comparator 76, such as the first input 78A, is connected to the output 74 of the second digital-to-analog converter 70 and the other input, such as the second input 78B, is adapted to receive a reference signal, such a second reference voltage $V_{ref2}$. The output 80 of the second comparator 76 forms the output 42 of the second SAR ADC module 38.

The second SAR ADC module 38 further includes a second successive approximation register logic unit 82, also called second SAR logic unit 82 and denoted SAR$_2$, connected to the output 80 of the second comparator 76, the second SAR logic unit 82 being adapted to control the second digital-to-analog converter 70.

The second feedback module 44 includes a second filter 84 for filtering the second residue signal E$_2$(z) before injecting it, as a second filtered residue signal $\widetilde{E}_2(z)$, back at input 40 of the second SAR ADC module 38.

The digital cancellation logic unit 52 is for example configure to apply the first transfer function H$_1$(z) to the first digital signal D$_1$(z) and the second transfer function H$_2$(z) to the second digital signal D$_2$(z), according to the following equation:

$$D_{out}(z) = H_1(z) \cdot D_1(z) + H_2(z) \cdot D_2(z) \quad [\text{Math 1}]$$

where D$_{out}$ represents the digital output signal,
H$_1$ represents the first transfer function,
D$_1$ represents the first digital signal,
H$_2$ represents the second transfer function, and
D$_2$ represents the second digital signal.

The first digital signal D$_1$(z) verifies for example the following equation:

$$D_1(z) = STF_1(z) \cdot V_{in}(z) + NTF_1(z) \cdot E_1(z) \quad [\text{Math 2}]$$

where D$_1$ represents the first digital signal,
STF$_1$ represents a first signal transfer function,
V$_{in}$ represents the analog input signal,
NTF$_1$ represents a first noise transfer function, and
E$_1$ represents the first residue signal.

The second digital signal D$_2$(z) verifies for example the following equation:

$$D_2(z) = STF_2(z) \cdot E_1(z) NTF_2(z) \cdot E_2(z) \quad [\text{Math 3}]$$

where D$_2$ represents the second digital signal,
STF$_2$ represents a second signal transfer function, E$_1$ represents the first residue signal,
NTF$_2$ represents a second noise transfer function, and
E$_2$ represents the second residue signal.

According to aforementioned equations (1), (2) and (3), the digital output signal D$_{out}$(z) verifies the following equation, written in a condensed manner:

$$D_{out}(z) = H_1 \cdot [STF_1 \cdot V_{in}(z) + NTF_1 \cdot E_1(z)] + H_2 \cdot [STF_2 \cdot E_1(z) + NTF_2 \cdot E_2(z)] \quad [\text{Math 4}]$$

thereby leading to the following equation, written in a condensed manner:

$$D_{out}(z) = H_1 \cdot STF_1 \cdot V_{in}(z) + [H_1 \cdot NTF_1 + H_2 \cdot STF_2] \cdot E_1(z) + H_2 \cdot NTF_2 \cdot E_2(z) \quad [\text{Math 5}]$$

Therefore, according to equation (5), the following equation is verified so as to cancel the first residue signal E$_1$(z):

$$H_1(z) \cdot NTF_1(z) + H_2(z) \cdot STF_2(z) = 0 \quad [\text{Math 6}]$$

In the example of FIG. 2, the first digital-to-analog converter 54, denoted C-DAC$_1$, contains a first capacitor array 86.

The first filter 68 is preferably a Finite Impulse Response filter, also called FIR filter, and accordingly denoted FIR$_1$.

The first filter 68 is preferably a second-order filter.

The first noise transfer function NTF$_1$(z) typically verifies the following equation:

$$NTF_1(z) = 1 - H_{F1}(z) \quad [\text{Math 7}]$$

where NTF$_1$ represents the first noise transfer function, and
H$_{F1}$ represents a transfer function of the first filter 68.

In the example of FIG. 2, the first filter 68 is preferably a second-order FIR filter. According to this example, the first filter 68 includes a first gain unit 88 for applying a gain G1 to the first residue signal E$_1$(z), a first first-stage delay unit 90 with gain a$_1$ connected to output of the first gain unit 88, a first second-stage delay unit 92 with gain a$_2$ connected to output of the first first-stage delay unit 90, and a third adder 94 connected to both outputs of the first first-stage delay unit 90 and the first second-stage delay unit 92.

According to this example, the transfer function of the first filter 68 verifies the following equation:

$$H_{F1}(z) = G_1 \cdot (a_1 z^{-1} + a_2 z^{-2}) \quad [\text{Math 8}]$$

An ideal first noise transfer function NTF$_1$(z) for second order noise shaping verifies the following equation, which requires G$_1$=2, a$_1$=1 and a$_2$=−0.5 as parameter values:

$$NTF_1(z) = (1 - z^{-1})^2 \quad [\text{Math 9}]$$

In the example of FIG. 2, the second digital-to-analog converter 70, denoted C-DAC$_2$, contains a second capacitor array 96.

The second filter 84 is preferably a Finite Impulse Response filter, also called FIR filter, and accordingly denoted FIR$_2$.

The second filter 84 is preferably a second-order filter.

The second noise transfer function NTF$_2$(z) typically verifies the following equation:

$$NTF_2(z) = 1 - H_{F2}(z) \quad [\text{Math 10}]$$

where NTF$_2$ represents the second noise transfer function, and
H$_{F2}$ represents a transfer function of the second filter 84.

In the example of FIG. 2, the second filter 84 is preferably a second-order FIR filter. According to this example, the second filter 84 includes a second gain unit 98 for applying a gain G2 to the second residue signal E$_2$(z), a second first-stage delay unit 100 with gain b$_1$ connected to output of the second gain unit 98, a second second-stage delay unit 102 with gain $b_2$ connected to output of the second first-stage delay unit 100, and a fourth adder 104 connected to both outputs of the second first-stage delay unit 100 and the second second-stage delay unit 102.

According to this example, the transfer function of the second filter 84 verifies the following equation:

$$H_{F2}(z)=G_2 \cdot (b_1 z^{-1} + b_2 z^{-2}) \quad \text{[Math 11]}$$

An ideal second noise transfer function $NTF_2(z)$ for second-order noise-shaping verifies the following equation, which requires $G_2=2$, $b_1=1$ and $b_2=-0.5$ as parameter values:

$$NTF_2(z)=(1-z^{-1})^2 \quad \text{[Math 12]}$$

Assuming that the first and second signal transfer functions $STF_1(z)$, $STF_2(z)$ are ideal and verify the following equation:

$$STF_1(z)=STF_2(z)=1 \quad \text{[Math 13]}$$

and also considering that the first transfer function $H_t(z)$ verifies the following equation:

$$H_1(z)=1 \quad \text{[Math 14]}$$

then aforementioned equations (6) and (9) lead to the following equation:

$$H_2(z)=-NTF_1(z)=-(1-z^{-1})^2 \quad \text{[Math 15]}$$

Therefore, in this example and according to equations (5), (6) and (12) to (15), the digital output signal $D_{out}(z)$ verifies the following equation:

$$D_{out}(z)=V_{in}(z)-(1-z^{-1})^4 \cdot E_2(z) \quad \text{[Math 16]}$$

Thus, the aforementioned equation (16) confirms that when each feedback module 30, 44 includes a respective second-order filter 68, 84 for filtering the respective residue signal $E_1(z)$, $E_2(z)$ before injecting it back at input of the respective SAR ADC module 24, 38, the analog-to-digital converting device 10 according to the invention provides a fourth-order noise-shaping performance.

The analog-to-digital converting device 10 according to the invention therefore allows obtaining improved results in comparison with state-of-the-art analog-to-digital converting devices, as it will be explained hereinafter in view of FIGS. 3 and 4.

Figure 3:
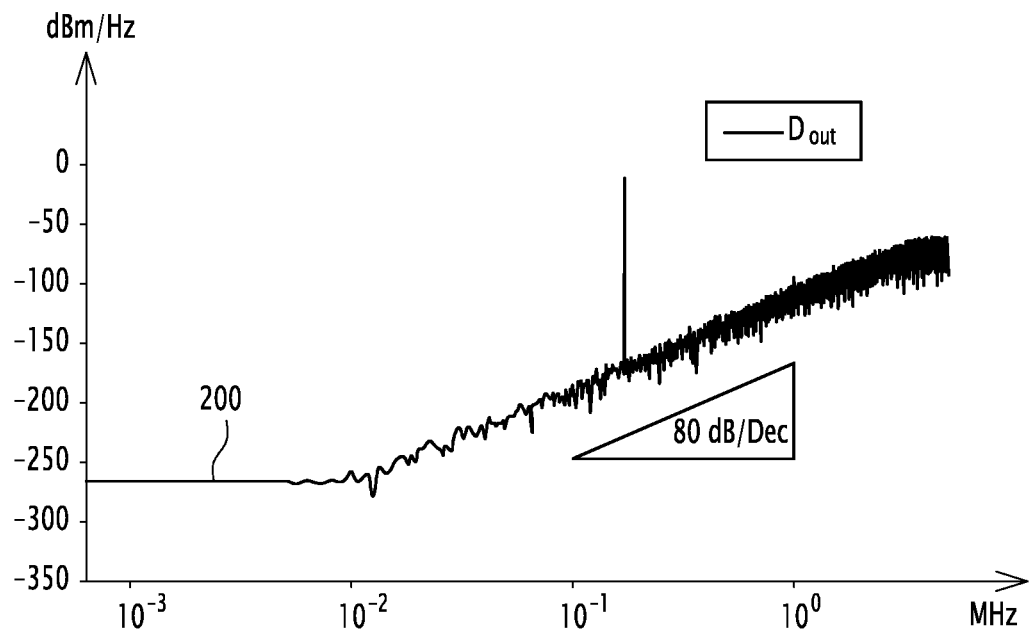
FIG. 3 is a set of two curves, each representing a simulated power spectral density of a digital output signal delivered by the analog-to-digital converting device, a first curve corresponding to the linear model of FIG. 1 and a second curve corresponding to the time-domain behavioral model of FIG. 2.
Figure 3:
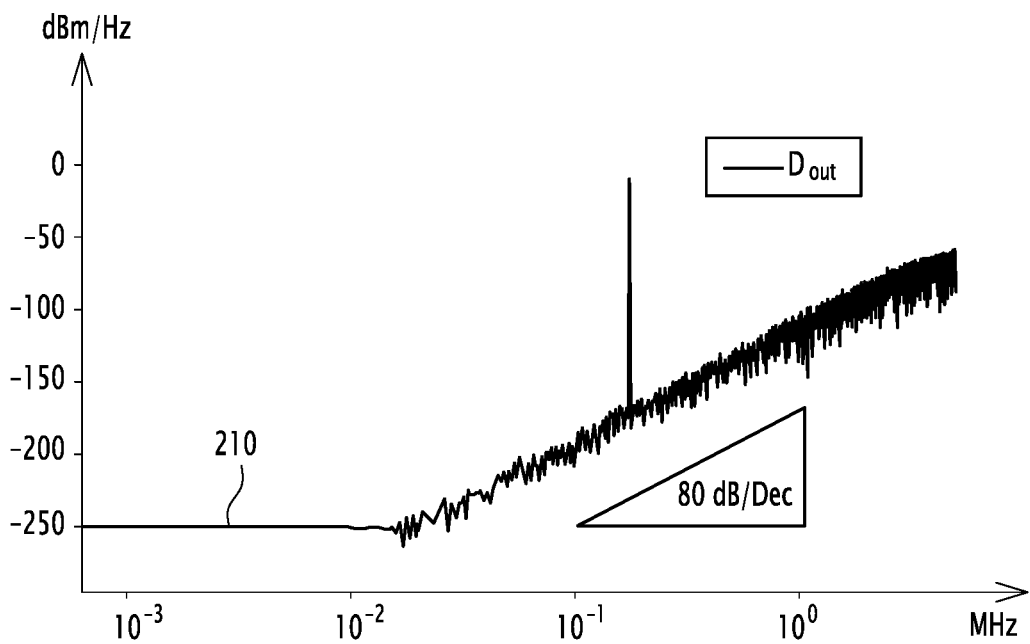

FIG. 3 is a set of two curves 200, 210, namely a first curve 200 and a second curve 210, each curve 200, 210 representing a simulated power spectral density of the digital output signal $D_{out}$ delivered by the analog-to-digital converting device 10, the first curve 200 corresponding to the linear model of FIG. 1 and the second curve 210 corresponding to the time-domain behavioral model of FIG. 2.

FIG. 3 therefore shows the power spectral density of the linear model and the behavioral model of the invention and demonstrates similar results for the two realizations. The 80 dB/Dec slope of each curve 200, 210 further proves the fourth-order noise-shaping performance of the analog-to-digital converting device 10 according to the invention.

Figure 4:
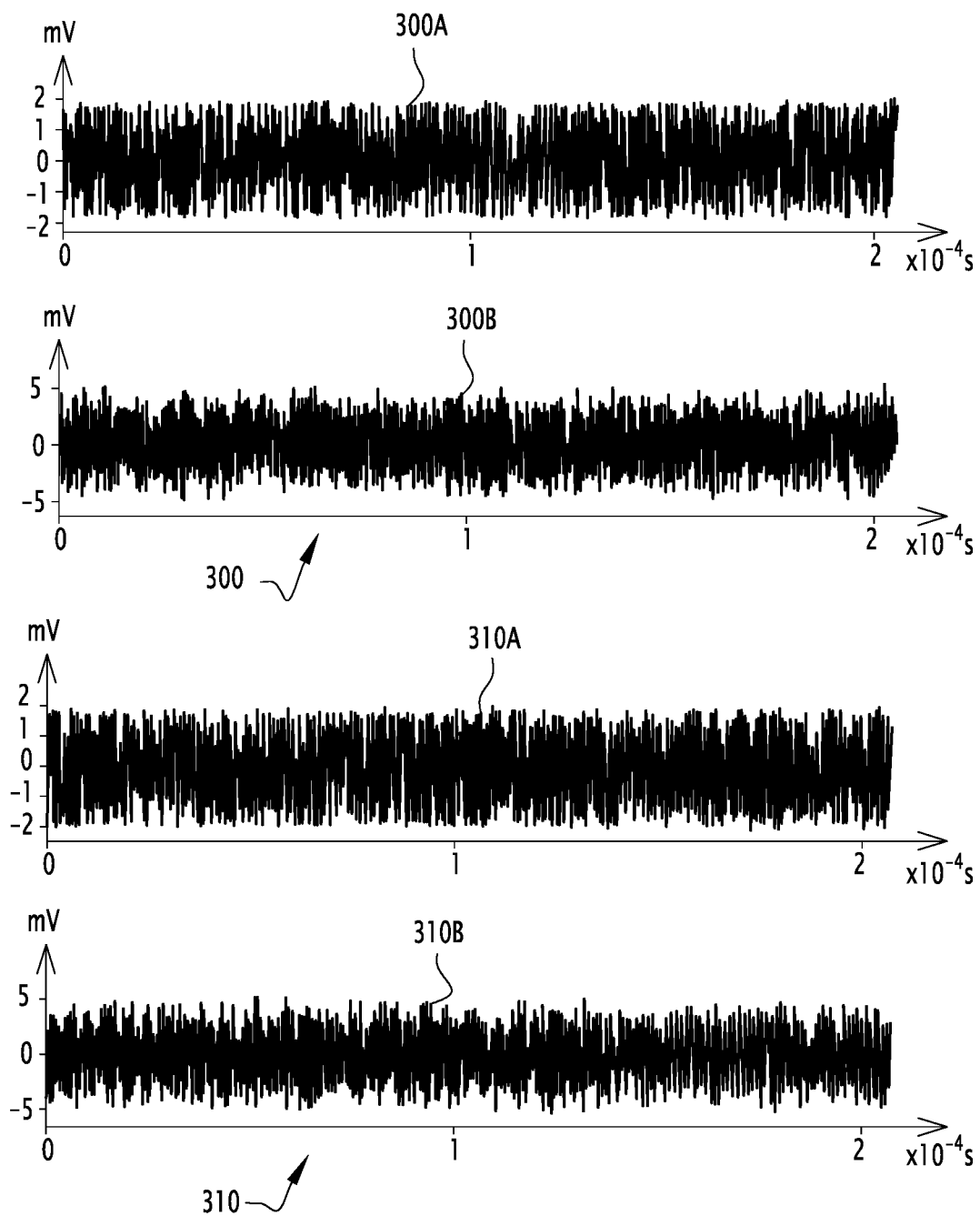
FIG. 4 is a set of two pairs of curves, each representing a time-domain error signal and respectively a filtered error signal for the second SAR ADC stage, a first pair of curves corresponding to the linear model of FIG. 1 and a second pair of curves corresponding to the time-domain behavioral model of FIG. 2.

FIG. 4 is a set of two pairs 300, 310 of curves, namely a first pair 300 and a second pair 310, each pair 300, 310 representing a time-domain error signal and respectively a filtered error signal for the second NS-SAR ADC stage 18. The first pair 300 corresponds to the linear model of FIG. 1 and the second pair 310 corresponds to the time-domain behavioral model of FIG. 2.

In FIG. 4, the first pair 300 includes a third curve 300A representing the time-domain error signal and a fourth curve 300B representing the filtered error signal for the second NS-SAR ADC stage 18, according to the linear model of FIG. 1. Similarly, the second pair 310 includes a fifth curve 310A representing the time-domain error signal and a sixth curve 310B representing the filtered error signal for the second NS-SAR ADC stage 18, according to the time-domain behavioral model of FIG. 2.

FIG. 4 therefore compares the time-domain error signal of the second NS-SAR ADC stage 18 for the two realizations. It also shows how filtering affects this error. As can be seen, it adds some noise to the analog-to-digital converting device 10, but it is not significant and cannot destroy the performance of the analog-to-digital converting device 10.

Thus, the analog-to-digital converting device 10 according to the invention offers several advantages in comparison to conventional noise-shaping successive approximation register analog-to-digital converters, as it will explained hereinafter.

First, the analog-to-digital converting device 10 according to the invention obtains a higher noise-shaping order by cascading NS-SAR ADC stages 16, 18 with a lower noise-shaping order capability and without stability concerns.

Then, extra circuit components are not required for the extraction of the error signal in the first NS-SAR ADC stage 16 to feed it as the input of the second NS-SAR ADC stage 18. So, the analog-to-digital converting device 10 has a simpler architecture because the analog error signal $E_1(z)$, $E_2(z)$ already exists on the respective digital-to-analog converter 54, 70, such as on the respective capacitor array 86, 96, at the end of a conversion. Further, the analog error signal $E_1(z)$ of the first digital-to-analog converter 54, such as on the first capacitor array 86, is usable as the input of the second NS-SAR ADC stage 18.

This also makes the analog-to-digital converting device 10 according to the invention more precise than conventional MASH converters, because of removing a digital-to-analog conversion of the respective output 28, 42 of SAR ADC module 24, 38, i.e. the quantizer's output, and also because of removing a subtracting step.

Further, each NS-SAR ADC stage 16, 18 provides a digital signal, namely the respective first and second digital signals $D_1(z)$, $D_2(z)$, with a specific resolution, so that the analog-to-digital converting device 10 allows providing two different resolutions simultaneously, namely a first resolution corresponding to the first operating mode M1 wherein the digital output signal $D_{out}(z)$ delivered is the first digital signal $D_1(z)$, and a second resolution corresponding to the second operating mode M2 wherein the digital output signal $D_{out}(z)$ delivered is a combination of the first and second digital signals $D_1(z)$, $D_2(z)$, for example at output of the digital cancellation logic 52.

The analog-to-digital converting device 10 according to the invention also offers flexibility for changing the noise-shaping order and resolution using a combination of the different NS-SAR ADC stages 16, 18, in particular via the selection module 22, which is able to select an operating mode from the first operating mode M1 and the second operating mode M2 of the multiplexer module 20. Therefore, the analog-to-digital converting device 10 provides a reconfigurable resolution architecture.

In addition, there is no restriction on the type of the feedback modules 30, 44, such as loops, loop filters or FIR filters, in the NS-SAR ADC stages 16, 18.

Further, the noise-shaping is performed by an error feedback technique, and the analog-to-digital converting device 10 according to the invention is no longer using operational transconductance amplifier (OTA). In other words, the analog-to-digital converting device 10 offers preferably an OTA-free topology.

The invention claimed is:

1. An analog-to-digital converting device for converting an analog input signal into a digital output signal, comprising:
   an input terminal for receiving the analog input signal;
   an output terminal for issuing the digital output signal;
   a first successive approximation register analog-to-digital conversion module, called first SAR ADC module, connected via its input to the input terminal and configured to deliver via its output a first digital signal;
   a first feedback module configured to receive a first residue signal from the first SAR ADC module and to process and inject it back at input of the first SAR ADC module;
   a second successive approximation register analog-to-digital conversion module, called second SAR ADC module, connected via its input to the first SAR ADC module to receive the first residue signal and configured to deliver via its output a second digital signal;
   a second feedback module configured to receive a second residue signal from the second SAR ADC module and to process and inject it back at input of the second SAR ADC module; and
   a multiplexing module connected to the output of the first SAR ADC module and to the output of the second SAR ADC module, the multiplexing module being configured to deliver the digital output signal at the output terminal,
   the first feedback module comprising a first filter for filtering the first residue signal before injecting it back at input of the first SAR ADC module.

2. The converting device according to claim 1, wherein the multiplexing module is configured to operate in a first operating mode wherein the delivered digital output signal is the first digital signal or in a second operating mode wherein the delivered digital output signal is a combination of the first and second digital signals.

3. The converting device according to claim 2, wherein the converting device further comprises a selection module for selecting an operating mode among the first operating mode and the second operating mode of the multiplexing module.

4. The converting device according to claim 1, wherein the first filter is a second order filter.

5. The converting device according to claim 1, wherein the first filter is a finite impulse response filter.

6. The converting device according to claim 1, wherein the second feedback module comprises a second filter for filtering the second residue signal before injecting it back at input of the second SAR ADC module.

7. The converting device according to claim 6, wherein the second filter is a second order filter.

8. The converting device according to claim 6, wherein the second filter is a finite impulse response filter.

9. The converting device according to claim 1, wherein the first SAR ADC module comprises:
   a first digital-to-analog converter with an input and an output;
   a first comparator with two inputs and an output, one input being connected to the output of the first digital-to-analog converter and the other input being adapted to receive a reference signal; and
   a first successive approximation register logic unit connected to the output of the first comparator, the first successive approximation register logic unit being adapted to control the first digital-to-analog converter;
   the input of the first digital-to-analog converter forming the input of the first SAR ADC module;
   the output of the first comparator forming the output of the first SAR ADC module.

10. The converting device according to claim 9, wherein the input of the second SAR ADC module is connected to the output of the first digital-to-analog converter.

11. The converting device according to claim 1, wherein the second SAR ADC module includes:
   a second digital-to-analog converter with an input and an output;
   a second comparator with two inputs and an output, one input being connected to the output of the second digital-to-analog converter and the other input being adapted to receive a reference signal; and
   a second successive approximation register logic unit connected to the output of the second comparator, the second successive approximation register logic unit being configured to control the second digital-to-analog converter;
   the input of the second digital-to-analog converter forming the input of the second SAR ADC module;
   the output of the second comparator forming the output of the second SAR ADC module.

12. The converting device according to claim 1, wherein the multiplexing module comprises a digital cancellation logic unit adapted to apply a first transfer function to the first digital signal and a second transfer function to the second digital signal, so as to cancel the first residue signal.

13. An electronic sensor comprising an analog-to-digital converting device for converting an analog input signal into a digital output signal, wherein the converting device is according to claim 1.

* * * * *